ELECTRONIC CHANNEL CUT-OFF MEANS
Filed Sept. 27, 1966
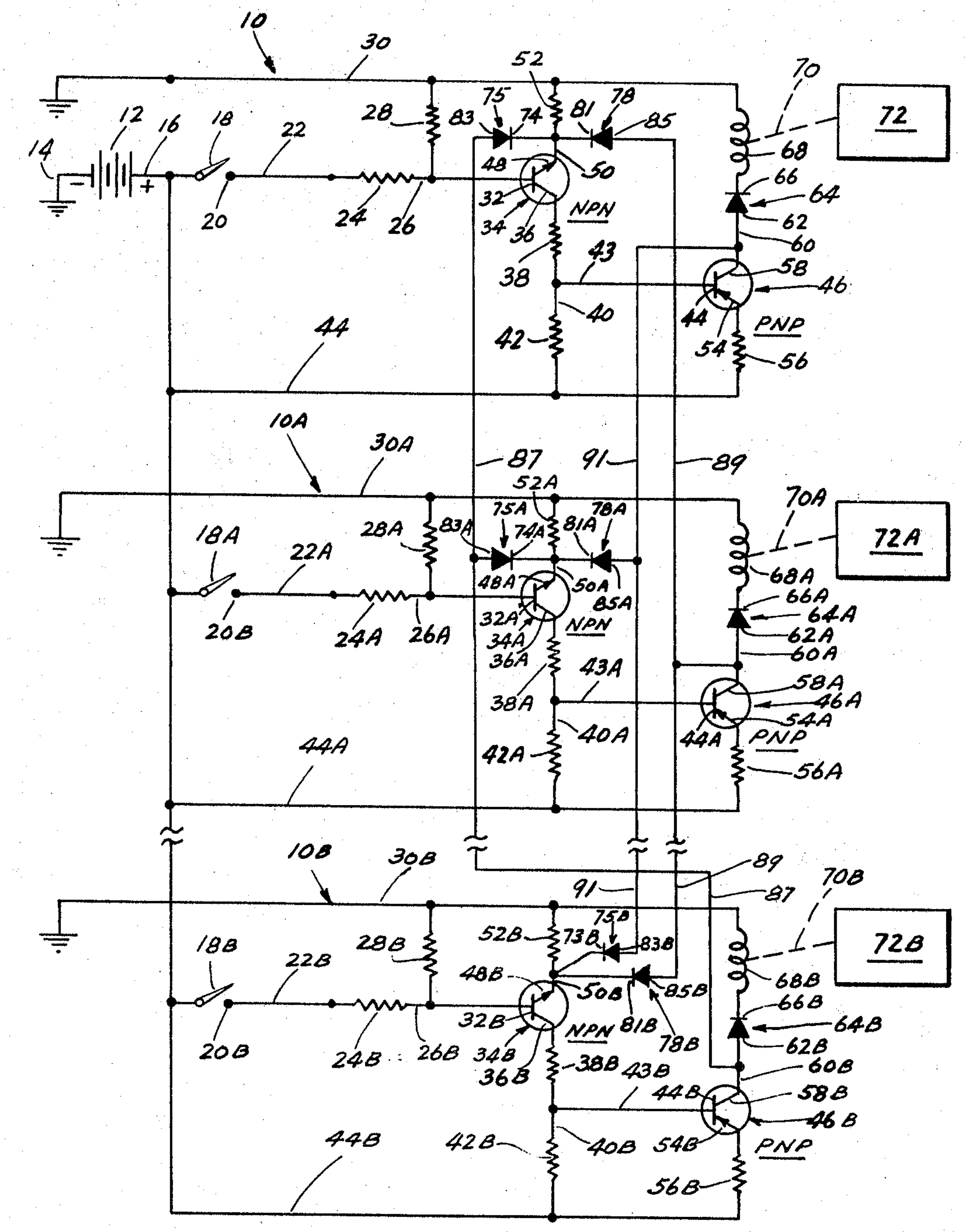
INVENTOR.
ALBERT J. NEWLAND
BY
ATTORNEY United States Patent Office 3,441,809

Patented Apr. 29, 1969

3,441,809

ELECTRONIC CHANNEL CUT-OFF MEANS

Albert J. Newland, Glen Rock, N.J., assignor to The Bendix Corporation, Teterboro, N.J., a corporation of Delaware Filed Sept. 27, 1966, Ser. No. 582,391

Int. Cl. H01h 47/02, 47/22

U.S. Cl. 317—136 8 Claims

ABSTRACT OF THE DISCLOSURE

An electronic interlock network for preventing simultaneous operation of separate signal channels wherein a circuit connection is provided from the output transistor of one channel to the input transistor of another channel. The output transistor of a channel that first conducts in response to an input signal thus serves as a control to prevent conduction of the other channels until the input signal first applied has been removed.

*Background*

Heretofore semiconductors in one channel have been so arranged that an input signal to a control electrode of one transistor may initiate conduction thereof to in turn provide an input signal to the control electrode of another transistor to render the same conductive. Such arrangements, however, do not inhibit conduction in another channel upon an input signal being applied to the other channel subsequent to the channel activated. While complex external switching apparatus as shown in a U.S. Patent No. 3,152,319, granted Oct. 6, 1964, to Bernard M. Gordon et al. and in a U.S. Patent No. 2,867,723, granted Jan. 6, 1959 to Carl P. Spaulding have been utilized in the past to prevent simultaneous conduction of two channels, such prior arrangements are responsive not to the presence of a first input signal applied to one channel, but instead to some additional circuit switching means. Moreover, while the prior arrangement disclosed in a U.S. Patent No. 3,154,697, granted Oct. 27, 1964, to Albert X. Widmer et al. provides a transistor 19 the conduction of which acts to cut off a second transistor 20, to prevent conduction thereof, and thus isolates certain diodes *16a*, *16b* and *16g* from providing a ready return path for the positive pulse produced at the output line 23, it will be seen that this prior arrangement is directed to a distinctly different problem of effecting the separation of bi-polar pulses into their positive and negative components prior to recombining for transmission on a common line. Such prior arrangement does not relate to an electronic channel cut-off means to simultaneously prevent conduction in one channel upon conduction in another channel upon signal pulses being present in both channels.

An object of the present invention is to provide a novel and simplified electronic channel cut-off means to transmit a signal pulse in the channel to which a pulse is first applied, together with means simultaneously effected by said first applied signal pulse to prevent subsequently applied signal pulses from being conducted through other channels which are thereupon rendered nonconductive by the first applied signal pulse.

Another object of the invention is to provide an electronic channel cut-off means for preventing simultaneous operation of separate signal channels in which each signal channel includes complementary transistors wherein an input pulse applied to a control electrode of an input signal receiving transistor initiates conduction thereof so as to in turn provide an input signal to a control electrode of another transistor to render the same conductive to provide an output signal to energize an actuate coil to impart motion to mechanical parts of a mechanical control device operated thereby, and which output signal is simultaneously fed back through a diode to another electrode of an input signal receiving transistor in another channel inhibiting conduction thereof so that the channel that first conducts serves as a controlling channel to prevent conduction of the other channel until the first applied input signal pulse is removed.

These and other objects and features of the invention are pointed out in the following description in terms of the embodiment thereof which is shown in the accompanying drawings. It is to be understood, however, that the drawing is for the purpose of illustration only and is not a definition of the limits of the invention, reference being had to the appended claims for this purpose.

*Description of the invention*

The drawing is a schematic circiut diagram of a prefered embodiment of the control arrangement in which coresponding parts in several signal channels have been indicated by like numerals bearing the suffix A and B to indicate respective parts of the several signal channels.

Referring now to the drawing, there has been indicated by the numbers 10, 10A and 10B separate signal channels which have been reduced in number so as not to confuse the drawing with undue multiplicity of elements. In the drawing, the breaks with respect to signal channel 10B are intended to show that the channels of circuit arrangements in excess of the number illustrated may be introduced within the broken portion by simple extrapolation of the circuits illustrated.

There is shown a suitable source of electrical energy or battery 12 having a negative terminal connected to ground by a conductor 14 and a positive terminal connected by a conductor 16 to switch arms 18, 18A and 18B of the respective signal channels 10, 10A and 10B. The switch arm 18 is arranged to be adjustably positioned to close a switch contact 20 connected through a conductor 22 to one end of a resistor 24 which in turn is connected through a conductor 26 to a resistor 28 leading to a grounded conductor 30. The resistors 24 and 28 provide a voltage divider network in which the conductor 26 at the junction thereof is connected to a base 32 of an NPN type transistor 34.

The transistor 34 has a collector element 36 connected through a resistor 38, conductor 40 and resistor 42 to a conductor 44 leading to the conductor 16 connected in turn to the positive terminal of the battery 12. The conductor 40 between resistors 38 and 42 is connected by a conductor 43 to a base 44 of a PNP type transistor 46. An emitter element 48 of the transistor 34 is connected through a conductor 50 and a resistor 52 to the grounded conductor 30.

Furthermore, an emitter element 54 of the transistor 46 is connected through a resistor 56 to the conductor 44 leading through conductor 16 to the positive terminal of the battery 12. A collector 58 of transistor 46 is connected to an anode element 62 of a diode 64. The diode 64, further has a cathode element 66 connected to one end of an electromagnetic winding 68 having an opposite end connected to the grounded conductor 30. The electromagnetic winding 68 upon energization serves as an actuator effective to drive a suitalbe mehcanical means 70 to operate a mechanical control device 72 which may be a decoder, typewriter, or other like device to be operated thereby.

Further, there are provided cut-off diodes 75 and 78 having cathode elements 74 and 81, respectively, connected to the conductor 50 which in turn leads to emitter element 48 of the NPN type transistor 34, while anode elements 83 and 85 of the diodes 75 and 78 are connected through conductors 87 and 89, respectively, to the conductors 60B and 60A leading from the collector elements 58B and 58A of the PNP type transistors 46B and 46A so as to render the transistor 34 nonconductive between the collector element 36 and the emitter element 48 upon either of the transistors 46B and 46A being rendered first conductive.

Similarly the conductor 87 is also connected to an anode element 83A of a cut-off diode 75A having a cathode element 74A connected to a conductor 50A leading to the emitter element 48A of the NPN type transistor 34A to render the same nonconductive upon the transistor 46B being rendered first conductive, while the conductor 89 is also connected to an anode element 85B of a cut-off diode 78B having a cathode element 81B connected to a conductor 50B leading to emitter element 48B of the transistor 34B to render the same nonconductive upon the transistor 46A being rendered first conductive.

Further, a conductor 91 leads from the conductor 60 connected to the collector element 58 of the PNP type transistor 46 to an anode element 85A of a cut-off diode 78A having a cathode element 81A connected to the conductor 50A leading to emitter element 48A of transistor 34A, while the conductor 91 is also connected to an anode element 83B of a cut-off diode 75B having a cathode element 73B connected to the conductor 50B leading to emitter element 48B of the transistor 34B so that upon the transistor 46 being first rendered conductive both transistors 34A and 34B will be rendered nonconductive.

In the respective signal channels 10A and 10B the remaining parts indicated by like numerals to those parts heretofore described with reference to the channel 10 and bearing the suffix A and B respectively, operate in a corresponding manner to the complementary parts of the signal channel 10 and therefore a detailed description thereof is not deemed necessary for our full understanding of the invention.

*Operation*

In the operation of the electronic channel cut-off means of the present invention, it will be seen that since the transistors 34, 34A and 34B are NPN type transistors the same are biased to cut off or nonconducting when no signal pulse appears on the input conductors 22, 22A and 22B, respectively. In this quiescent state no positive voltage appears at the output conductors 60, 60A and 60B leading from the collector elements of the PNP type transistors 46, 46A and 46B, respectively, since the bases 44, 44A and 44B thereof have an effective positive bias applied thereto through the respective resistors 42, 42A and 42B in such quiescent state. Thus in such quiescent state no current will flow through the respective transistors 46, 46A and 46B and the electromagnetic actuator coils 68, 68A and 68B will be maintained in a deenergized condition. In order then to activate one or the other of the coils 68, 68A and 68B, a positive signal pulse is applied at the conductors 22, 22A or 22B, by the selective closing of one or the other of the control switches 18, 18A or 18B.

Thus for example, upon the switch 18 being the first to close a voltage pulse will be applied through the voltage divider formed by the resistors 24 and 28, whereupon a voltage of for example, less than 50% of the supply voltage provided by the source 12 will appear at the base 32 of the NPN type transistor 34. Upon the base 32 becoming thereupon positively biased, such bias applied to the base 32 will be more positive than the emitter element 48 of the NPN type transistor 34 so as to thereupon render the transistor 34 conductive.

The resulting flow of current through the transistor 34 upon the same being thus rendered conductive will cause a less positive voltage to appear at the base 44, of the PNP type transistor 46 than that on the emitter element 54 of the transistor 46. Under such condition, transistor 46 will thereupon conduct causing a positive voltage to appear at the conductor 60 which will be more than 50% of the supply voltage provided by the source 12. This positive voltage on being initially applied to the conductor 60 will be simultaneously applied through the conductor 91 to the anode elements 85A and 83B of the diodes 78A and 75B and through these diodes to the emitter elements 48A and 48B of the NPN type transistors 34A and 34B, respectively. As this voltage is then more positive than that applied to the bases 32A and 32B of the transistors 34A and 34B through their respective voltage divider resistors 24A and 28A, and 24B and 28B, the transistors 34A and 34B will be rendered nonconductive.

The current flow through transistor 46 thus energizes coil 68 and simultaneously prohibits conduction in the other signal channels 10A and 10B which in turn prevent energization of the actuator coils 68A and 68B. The actuator coil 68 upon such energization is then effective to impart motion to the mechanical device 72, while such conduction of electrical energy by the transistor 46 will simultaneously prevent the other signal channels 10A and 10B from being activated so long as the control switch 18 remains closed, and regardless of the subsequent closing of the other control switches 18A and 18B. Further the diode 64 serves to protect the transistor 46 upon the switch 18 being suddenly opened, so that the sudden decay of current in the electromagnetic winding 68 resulting in an induced reverse current breakdown voltage in the winding 68 is prevented from effecting or damaging the transistor 46 due to the reverse current blocking action provided by the diode 64 which has the cathode element 66 connected to the electromagnetic winding 68.

It will be seen then that the signal channel 10, 10A or 10B which first conducts is the controlling channel and no other channel can conduct until the first channel to conduct is released. If activation of either of the channels 10A or 10B by closing switches 18A and 18B occurs, the channel in which the signal pulse first appears at the conductor 22A or 22B will be the conducting channel just as described above. The same action described will occur.

However, in the interim period, while one channel is conducting, upon the control switch of the other channels being closed, as stated, there will be no conduction in the subsequentially activated channel. If the signal from the initial conducting channel is now terminated by the opening of the control switch, for example switch 18, the interim activated channel, if the signal pulse applied thereto, for example by the closure of switch 18A, still appears, the channel 10A will now become the conducting channel and its respective control coil 68A will be energized by positive voltage greater than 50% of the supply voltage which will now appear at the output conductor 60A. This positive voltage appearing at the conductor 60A will also appear, as related above, on the emitter elements of the transistors 34 and 34B of the other channels 10 and 10B to prevent the same from becoming conductive.

It should be further noted that if the signal from the initial conducting channel is terminated by the opening of the control switch, for example switch 18, and the signal pulses be still applied to more than one interim activated channel, for example by the closure of both switches 18A and 18B, one of the channels 10A or 10B will then become conductive of energizing current for the respective electromagnetic windings 68A or 68B, depending upon the turn-on time of the transistors of the simultaneously activated channels since by the nature of transistor construction one will conduct, at some instantaneous point in time prior to conduction of the other even though a signal source of the same magnitude appears at the respective control elements at the same time.

Thus simultaneous energization of electromagnetic windings, such as the windings 68A and 68B, controlled through separate signal channels 10A and 10B is prevented in the present invention by the excitation source of the first to be activated signal channel, in the case given the channel 10, or by the excitation source of the first to be activated signal channels, as upon the switches 18A and 18B being closed at the time that the initially closed switch 18 is opened. There is no complex switching mechanism required to effect the desired result. Thus the configuration of the present invention has the advantage of providing a simplified electrical network for effectively eliminating simultaneous signal pulses which may be undesirable pulses. The undesirable pulses are prohibited from being decoded and simultaneous motion of mehcanical parts of mechanical decoders is thereby prevented.

While only one embodiment of the invention has been illustrated and described, various changes in the form and relative arrangement of the parts, which will now appear to those skilled in the art may be made without departing from the scope of the invention. Reference is, therefore, to be had to the appended claims for a definition of the limits of the invention.

What is claimed is:

1. In a multiple channel signal system of a type including a source of electrical energy, each channel including separately operable first means for selectively applying signal pulses from said source of electrical energy to said channels, and each channel including a corresponding actuating means; the improvement comprising second means in each channel to control energization of the actuating means in the corresponding channel, third means in each of said signal channels responsive to an initial signal pulse selectively applied by said separately operable first means from said source of electrical energy to render the third means effective to cause the second control means to be operative to energize the actuating means from said source, and feedback means simultaneously rendered effective upon said last mentioned operation of said second means for causing the signal pulse responsive third means in other of said multiple channels to be thereupon rendered nonresponsive to a signal pulse.

2. The improvement defined by claim 1 in which the feedback means is simultaneously rendered effective upon the operation of the second means to cause the signal pulse responsive third means in the other of said multiple channels to be thereupon rendered nonresponsive to a subsequently applied signal pulse for the duration of the initial signal pulse.

3. The improvement defined by claim 1 in which the second means in each channel includes a current flow control device having a control element, the third means in each channel includes another current flow control device having a control element, the control element of the current flow control device of the third means being responsive to the initial signal pulse to render the last mentioned device conductive of electrical energy, and the control element of the current flow control device of the second means being responsive to the flow of current through the current flow control device of the third means to in turn render the current flow control device of the second means conductive of flow of electrical energy to effect energization of the actuating means in the corresponding channel, and the feedback means including a unidirectional current flow control device connected at an output of the current flow control device of the second means and effective upon a change in the potential applied at said output by the conductivity of the current flow control device of the second means to so bias the current flow control device of the third means in the other of said multiple channels as to thereupon render the last mentioned current flow control device in the other of said channels nonresponsive to a subsequent signal pulse.

4. The improvement defined by claim 3 including an electromagnetic winding in the actuating means, and a rectifier connected intermediate the electromagnetic winding and the output of the current flow control device of the second means, the rectifier being effective to prevent a reverse current breakdown voltage from being applied at the output of the current flow control device of the second means upon termination of flow of energizing current to the electromagnetic winding of the actuating means.

5. The improvement defined by claim 3 in which the third means includes a voltage divider means for reducing the value of the signal pulse applied from said source to the control element of the current flow control device of the third means, and the unidirectional current flow control device of the feedback means being effective to apply from the output of the current flow control device of the second means a biasing voltage of a greater value to render the current flow control device of the third means of the other of said channels nonresponsive to subsequently applied signal pulses for the duration of the initial signal pulse.

6. The combination defined by claim 1 in which the third means includes a first transistor having a base, an emitter element and a collector element, a first resistance network connecting the collector and emitter elements of the first transistor to the source of electrical energy, a first voltage divider network connected across the source of electrical energy by the separately operable first means, means connecting the first voltage divider network to the base of the first transistor to apply the initial signal pulse at a reduced voltage value thereto from said source upon operation of the first means, and the initial signal pulse acting to render the first transistor effective in one sense, and the second means includes a second transistor having a base, an emitter element and a collector element, a resistor and an electromagnetic winding for operating the actuating means, the resistor and winding connecting the respective emitter and collector elements of the second transistor to the source of electrical energy, and the first resistance network including a second voltage divider network, means connecting the second voltage divider network to the base of the second transistor to cause the second transistor to be rendered effective in one sense to cause energization of the electromagnetic winding of the actuating means from the source of electrical energy upon the first transistor being rendered effective in the one sense, and the feedback means including a unidirectional current flow control diode connected between the collector element of said second transistor and the emitter element of the first transistor of other of said channels and effective upon the last mentioned second transistor being rendered effective in the one sense to apply a reverse bias to the emitter element of the first transistor of the other of said channels having a greater voltage value than subsequent signal pulses applied to the base of said last mentioned first transistor to maintain said last mentioned first transistor effective in another sense and nonresponsive to the subsequent signal pulse.

7. A channel bias cut-off apparatus comprising a plurality of input pulse signal channels, each channel including an approximately equal signal source voltage, separately operable means to selectively connect said signal source voltage to a voltage dividing network, two transistors of opposite types in each channel so arranged that upon one of said transistors being rendered conductive by a signal pulse applied through said network the other transistor is also rendered conductive of electrical energy from said signal source voltage, feedback means at an output of the other transistor in each of said channels to reversely bias the one transistor in the other of said channels to prevent simultaneous conduction of the other of said channels upon one of said channels being rendered first conductive, and an actuator means energized by the current from the output of the other transistor in said conducting channel.

8. In a channel bias cut-off apparatus for transmitting a signal pulse, a plurality of input channels, a signal source voltage to selectively apply an input signal pulse to each channel, each channel including a voltage dividing network, a pair of transistors of opposite type so arranged that only when one transistor is conductive is the other transistor rendered conductive, unidirectional voltage feedback means operatively connected at the output of each of said other transistors to reversely bias upon conduction of said other transistor in one channel the one transistor in the other of said channels, said feedback means effective to prevent conduction of the one transistor of the other of said channels upon the one transistor of the other of said channels upon the one transistor of the corresponding channel being rendered first conductive so that the channel first receiving an input pulse is rendered conductive while other of said input channels may be rendered nonconductive.

References Cited

UNITED STATES PATENTS 3,202,967 8/1965 Wolff ------------ 317—138 X

LEE T. HIX, *Primary Examiner.*

U.S. Cl. X.R.

307—232, 117, 255; 317—137, 148.5; 340—147

FO-1050
(5/69)

UNITED STATES PATENT OFFICE
CERTIFICATE OF CORRECTION

Patent No. 3,441,809 Dated April 29, 1969

Inventor(s) Albert J. Newland

It is certified that error appears in the above-identified patent and that said Letters Patent are hereby corrected as shown below:

In claim 8, column 7, delete the entire line 10 including "transistor of the other of said channels upon the one".

SIGNED AND SEALED

OCT 21 1969

(SEAL)

Attest:

Edward M. Fletcher, Jr.
Attesting Officer

WILLIAM E. SCHUYLER, JR.
Commissioner of Patents